United States Patent [19]
Polichette et al.

[11] 3,994,727
[45] *Nov. 30, 1976

[54] FORMATION OF METAL IMAGES USING REDUCIBLE NON-NOBLE METAL SALTS AND LIGHT SENSITIVE REDUCING AGENTS

[75] Inventors: Joseph Polichette, South Farmingdale; Edward J. Leech, Oyster Bay, both of N.Y.

[73] Assignee: Photocircuits Divison of Kollmorgen Corporation, Glen Cove, N.Y.

[ * ] Notice: The portion of the term of this patent subsequent to Nov. 30, 1993, has been disclaimed.

[22] Filed: July 11, 1974

[21] Appl. No.: 487,737

Related U.S. Application Data

[63] Continuation-in-part of Ser. No. 167,435, July 29, 1971, Pat. No. 3,772,078, and a continuation-in-part of Ser. No. 225,645, Feb. 11, 1972, Pat. No. 3,930,963.

[52] U.S. Cl. .................................. 96/38.4; 96/48 R; 96/48 PD; 96/49; 96/67; 96/88; 96/91 N; 96/92; 96/93; 204/38 B; 427/42; 427/43; 427/53; 427/56; 427/96; 427/97; 427/98; 427/261; 428/137
[51] Int. Cl.² ...................... G03C 5/00; G03C 5/24; G03C 1/76; B32B 15/00
[58] Field of Search ........... 96/88, 92, 67, 93, 91 R, 96/91 N, 48 R, 48 PD, 49, 38, 4; 117/130 E, 34, 47 A, 93.3, 212, 227, 213, 217, 160 R; 204/38 B; 427/53, 96, 42, 97, 98, 56, 205, 261, 283, 43; 428/913, 137

[56] References Cited
UNITED STATES PATENTS

| | | | |
|---|---|---|---|
| 3,436,233 | 4/1969 | Jackson | 17/130 |
| 3,445,230 | 5/1969 | Francis | 96/88 |
| 3,562,005 | 2/1971 | De Angelo et al. | 117/130 |
| 3,615,732 | 10/1971 | Shipley et al. | 117/130 |
| 3,627,558 | 12/1971 | Roger et al. | 117/47 |
| 3,704,208 | 11/1972 | Russo | 117/47 |
| 3,772,056 | 11/1973 | Polichette et al. | 96/88 |
| 3,772,078 | 11/1973 | Polichette et al. | 96/88 |

*Primary Examiner*—Roland E. Martin, Jr.
*Assistant Examiner*—Richard L. Schilling
*Attorney, Agent, or Firm*—Morgan, Finnegan, Pine, Foley & Lee

[57] ABSTRACT

Non-conductive real images are formed on substrates by depositing reducible metal salt compositions thereon from an aqueous acidic solution of pH 1.5–5 containing bromide ions and exposing the coated substrates to radiant energy to reduce the metal salt to metallic nuclei and to produce a real image of metal, which is intensified and built up by electroless metal deposition. The metal salt composition can either be selectively deposited and then exposed, or uniformly deposited and then selectively exposed, to produce the real image.

59 Claims, No Drawings

FORMATION OF METAL IMAGES USING REDUCIBLE NON-NOBLE METAL SALTS AND LIGHT SENSITIVE REDUCING AGENTS

Cross Reference to Related Applications

This application is a continuation-in-part of our application Ser. No. 167,435 filed July 29, 1971 and issued as U.S. Pat. No. 3,772,078 on Nov. 13, 1973 and also of our copending application Ser. No. 225,645 filed Feb. 11, 1972 and now U.S. Pat. No. 3,930,963.

BACKGROUND OF THE INVENTION

This invention relates to novel and improved methods for selectively metallizing bodies and to the products which result from such methods.

More particularly, the present invention relates to imposing, by thermal or radiant energy, real images comprising non-conductive metallic areas on the surfaces of such bodies. Such images are then made clearer and built up with deposits of electroless metal.

Although applicable whenever it is desired to apply a metallic coating to a substrate, as for example, for decorative or protective effects, or to make electrical conductors of a wide variety of shapes and configurations, the procedures for metallization herein are particularly useful for making real images on a variety of base materials, e.g., resinous insulating laminated bases or porous non-conductive materials, e.g., cloth, fiberglass, paper, cardboard, ceramics and the like.

It is a primary object of this invention to provide a process to produce real images on substrates, which can be built up by electroless plating and, optionally, subsequent electroplated metal deposition.

Another principal object of this invention is to provide improvements in metallization processes in which a base is selectively sensitized to metallization by electroless plating.

An additional object of this invention is to provide base materials and processes for selective electroless metallization in which there are employed non-noble metal sensitizers which are much more economical in cost, but equivalent in performance to the noble metal-containing sensitizers used until now.

Another object of this invention is to provide adherent electroless metal coatings bonded in selected areas to base materials.

The desired selectivity can be obtained according to this invention either by treating predetermined areas of the substrate by well-known techniques such as printing, free-hand drawing, lithographing, silk screening, embossing with textile rollers, and the like, or by treating the entire surface and selectively exposing predetermined areas through a mask, through negatives, with heated dies, and the like.

It has now been discovered that an electroless metal deposit can be selectively and adherently applied to a substrate. The method uses a real image in selected areas on the surface, the image being catalytic to the build up of a metal layer thereon by electroless metal deposition. The real image comprises a non-conductive layer of metal nuclei. Although the process can produce real images or prints of any kind, its selectivity facilitates the production of current conductor lines, plates or terminals, as in the manufacture of printed circuits and contributes to the decorative or design process, as in the manufacture of name plates dials and other metallized plastics. In all cases, when following the teachings herein, there are obtained outstanding, unexpectedly high bond strengths between the electroless metal and the base, as well as excellent resolution of the image formed.

SUMMARY OF THE INVENTION

The present invention involves a method for selectively metallizing insulating materials with real images by steps that include depositing on said substrate a layer of a radiation-sensitive composition by treating the substrate with a solution having a pH between about 1.5 and 4.0 as well as a minor content by weight of at least one halide ion of the group consisting of chloride, bromide and iodide ions and comprising a reducible salt of a non-noble metal with the cations of said metal present in a larger proportion of equivalents than said halide ions, a radiation-sensitive reducing agent for said salt and a secondary reducer in an aqueous medium; exposing said layer to radiant energy to reduce said metal salt to metallic nuclei thereof and wherein at least one of said treating and exposing steps is restricted to a selected pattern on said substrate to produce a non-conducting real image of said metallic nuclei in said selected pattern and capable of directly catalyzing the deposition thereon of metal from an electroless metal bath.

Other aspects of this invention relate to a combination process in which the foregoing procedure is followed by an electroless metal treatment of the image-bearing substrate to build up a layer of electroless metal on the image as well as to certain apertured intermediate articles that have been coated with the radiation-sensitive composition but not exposed to activating radiation. Still other aspects are concerned with preferred materials, formulations and process conditions.

DESCRIPTION OF THE INVENTION

According to the present invention, substrates are metallized by either:

i. providing selected areas of the substrate with a layer of a metal salt composition which on exposure to radiant energy is converted to metallic nuclei and exposing the layer to radiant energy to produce a non-conducting, real image of a desired pattern or ii. providing the substrate with a layer of a metal salt or metal salt composition which on selective exposure to radiant energy is converted into metal nuclei and exposing the layer to radiant energy to produce a non-conducting, real image of a desired pattern, and building up the pattern by contacting the metallic nuclei with an electroless metal deposition solution.

In carrying out the present invention, the substrate is cleaned, if necessary, then provided with a layer of the metal salt or metal salt composition, e.g., by printing or otherwise marking selected areas of the substrate, e.g., with a solution of the salt or the salt composition, or by use of suitable masking to protect the areas which are to be free of the image deposit during as well as after the coating and reduction. On the other hand, the entire substrate may be covered with a layer of the metal salt or metal salt composition and selected areas only may be reduced by expedients such as exposure to radiant energy through a mask or by application of a heated die, and the like.

Among the materials which may be used as bases in this invention are inorganic and organic substrates, such as glass, ceramic, porcelain, resins, paper, cloth, and the like. Unclad laminated resinous structures, molded resins and laminated resins may also be used.

Among the materials which may be used as the bases, may be mentioned unclad insulating thermosetting resins, thermoplastic resins and mixtures of the foregoing, including fiber, e.g., fiber glass, impregnated embodiments of the foregoing.

Included in the thermoplastic resins are acetal resins; acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane, melamine-formaldehyde; phenol formaldehyde and phenol furfural copolymers, alone or compounded with butadiene acrylonitrile copolymers or acrylonitrile-butadiene-styrene copolymers; polyacrylic esters; silicones; urea formaldehydes; epoxy resins; allyl resins; glyceryl phthalates; polyesters; and the like.

Porous materials, comprising paper, wood, Fiberglass, cloth and fibers, such as natural and synthetic fibers, e.g., cotton fibers, polyester fibers, and the like, may also be metallized in accordance with the teachings herein. The invention is particularly applicable to the metallization of resin, e.g., epoxy resin, impregnated fibrous structures and varnish, e.g., epoxy resin varnish, coated resin impregnated fiber structures of the type described.

The substrates selectively covered with a real image comprising catalytic metal nuclei generically will include any insulating materials so covered, regardless of shape or thickness, and includes thin films and strips as well as thick substrate.

The bases referred to herein are inorganic or organic materials of the type described which have a real image in the form of a surface layer comprising metallic nuclei which are catalytic to the reception of electroless metal, "catalytic" in this sense referring to an agent which is capable of reducing the metal ions in an electroless metal deposition solution to metal.

The real images produced herein comprise metallic nuclei in which the metals are selected from Groups VIII and IB of the Periodic Table of Elements. These include gold, silver, iridium, platinum, palladium, rhodium, copper, nickel, cobalt and iron. Preferred metals are selected from Period 4 of Groups VIII and IB; iron, cobalt, nickel and copper. Especially preferred for the production of the real image is copper. When employing an iron salt as the reducible metal salt, a quick rinse in a suitable strong reducing agent, such as sodium borohydride, after the exposure step is usually desirable for producing maximum density of the image.

If desired, the substrate can be coated with an adhesive which is conventional for this purpose in this field before being coated with the compositions of this invention.

In producing the real image, the metal is reduced from its salt or a composition of the salt in situ in selected areas on the surface of the base by application of radiant energy, e.g., heat or light, such as ultraviolet light and visible light, x-rays, electron beams, and the like.

In one manner of proceeding, a solution of a heat-reducible metal salt, e.g., cupric formate, and optionally a developer, e.g., glycerine, and a surfactant in water is selectively coated onto the base, dried and heated, e.g., at 100° to 170° C., preferably at 130° to 140° C., until the surface layer has darkened in color, indicating the metallic salt has been reduced to a non-conductive real image comprising, e.g., copper, nickel, cobalt or iron nuclei. The base is now catalytic to the deposition of electroless metal, e.g., copper, nickel, cobalt, gold or silver, on the surface of the base and on the walls in any holes in the base. Alternatively, the entire base is provided with a layer of the salt and the image is formed by heating selected areas, as with a hot die.

In more detail, according to such a heat-activation process, the base, if necessary, is cleaned and pretreated by one of the methods to be described. The clean base is printed in selected areas with one of the metal salt solutions, to be described in detail hereinafter, for a short time, e.g., 1–3 minutes. The base and layer thereon is then placed in a heated area, e.g., an oven for 10 to 20 minutes, or until the metal salt is reduced to form a real image comprising metallic nuclei. The temperature of heating can range from 100° to 170° C., but the preferred range is 130°–140° C. The reduction is considered completed when the coating has darkened in color. The base with the image thereon is then removed from the heated area and allowed to cool. The image is catalytic to electroless metal deposition and can be processed in known ways, as will be described hereinafter, for the subsequent build-up of electroless metal plating and, optionally, a top layer of electroplating. Alternatively, the entire base can be provided with a layer of the metal salt and the image produced by heating selected areas.

In another manner to proceeding, a solution having a pH in the range of about 1.5 to 4.0 with a content of certain halide ions (i.e., bromide, iodide and/or chloride ions) and comprising a metal salt composition, e.g., cupric formate, and a light-sensitive reducing agent, a second reducing agent, and optionally (for hard to wet surfaces) a surfactant, in water is selectively printed on the base, dried and exposed to ultraviolet light radiation to form a real image of metallic nuclei. Suitable light-sensitive reducing agents are aromatic diazo compounds, iron salts, e.g., ferrous or ferric oxalate, ferric ammonium sulfate, dichromates, e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride, or compounds of silver, palladium, gold, mercury, cobalt, nickel, zinc, iron, etc., the latter group optionally being added in trace amounts of 1 mg. to 2 g. per liter. Among the second reducers are polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducers are aldehydes, such as formaldehyde, benzaldehyde, acetaldehyde, n-butyraldehyde, polyamides, such as nylon, albumin and gelatin; leuco bases of triphenylmethane dyes, such as 4-dimethylamino triphenylmethane, 4,4',-4''-tris-dimethylamino-triphenylmethane; leuco bases of xanthene dyes, such as 3,6-bis dimethylamino xanthene and 3,6-bis dimethylamino-9-(2-carboxyethyl)xanthene; polyethers, such as ethylene glycol diethyl ether, diethylene glycol diethyl ether, tetraethylene glycol dimethyl ether, and the like. Among the suitable surfactants are polyethenoxy non-ionic ethers, such as Triton X-100, manufactured by Rohm & Haas Co., and non-ionic surfactants based on the reaction between nonyl phenol and glycidol, such as Surfactants 6G and 10G manufactured by Olin Mathieson Company.

This treating solution contains an acidifying agent in the form of an acid or acid salt for adjusting the pH of the aqueous solution to usually between about 2.0 and 4.0 (preferably 2.5 to 3.8) and a small quantity of iodide, bromide or chloride ions, as that combination of additives provides a surprising effect in substantially intensifying the image that is formed subsequently by exposure of the treated substrate to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycine, etc.) or by some additives for introducing halide ions (e.g., hydrochloric acid). Similarly, some of the halide ions may be introduced as components of the reducible metal salt (e.g., cupric chloride).

Among the many suitable acidic substances which may be employed in controlling or adjusting the pH of the sensitizing solution are fluoboric acid, citric acid, lactic acid, phosphoric acid, sulfuric acid, acetic acid, formic acid, boric acid, hydrochloric acid, nitric acid, and the like.

A wide variety of bromide, chloride and iodide salts and other halide generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, sodium bromide, potassium iodide, sodium iodide, lithium chloride, magnesium chloride, magnesium iodide, potassium bromide, magnesium bromide, and the like. Bromide salts are preferred, as they produce a higher degree of sensitivity (i.e., darker and denser images) on the substrate than the corresponding chloride in at least certain instances.

The halide ions constitute only a minor proportion of the solute and may typically range from about 0.045 to 1.6% (preferably about 0.13 to 0.45%) based on the total weight of dissolved solids. The amount of halogen may be stated otherwise as between about 0.9 and 25 milliequivalents of halogen per liter of the sensitizing solution, preferably about 2.5 to 9 milliequivalents e.g., 0.3–1.0 g./l. for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least about 2:1 and preferably about 4:1 to 100:1.

The substitution of a compound yielding fluoride ions for a substantial proportion, but not all, of the iodide, bromide or chloride ions in some sensitizer formulations appears to increase the sensitizing effect somewhat.

After exposure to ultraviolet light radiation for a short time, the reduction to metallic nuclei is generally complete. Sometimes, the reduction can be further enhanced by heating at a temperature of up to about 130° C. for a few minutes more.

Alternatively, instead of selectively printing, if the base is coated all over with the metal salt composition and exposed through a positive or negative of an original pattern or photograph, there will form a real image on selected portions of the surface from which the background can be removed by washing out the unexposed (unreduced) portion of the metal layer, e.g., in running water for about 5 to 10 minutes. The real image on the base is reinforced by deposition of electroless metal from a solution onto the image so as to build up metal on the base and, in suitable instances, on the walls in any holes in the base in which metal nuclei have been formed by exposure to ultraviolet light.

In all cases the coating of metal salts should be dry before selective exposure to radiant energy. Otherwise images may reverse. In all such embodiments, the metal accelerators described above will provide enhanced rates of image formation. For maximum image density, it is generally preferable to develop and rinse the substrate and carry out the electroless metal treatment described hereinafter within a few hours after such exposure, especially in the case of short exposures to radiant energy.

Typically, the autocatalytic or electroless metal deposition solutions for use in depositing electroless metal on the bodies having a real image comprised of catalytic metal nuclei prepared as described herein comprise an aqueuos solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, electroless nickel, electroless cobalt, electroless silver and electroless gold solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediamine-tetraacetic acid, and a pH adjuster, e.g., sodium hydroxide.

Typical electroless nickel baths which may be used are described in Brenner, Metal Finishing, November 1954, pages 68 to 76, incorporated herein by reference. They comprise aqueous solutions of a nickel salt, such as nickel chloride, an active chemical reducing agent for the nickel salt, such as the hydrophosphite ion, and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as gold reserve. The pH of the bath will be about 13.5 or between about 13 and 14, and the ion ratio of hypophosphite radical to insoluble gold salt may be between about 0.33 and 10:1.

A typical electroless cobalt bath is described in the Examples as well as a useful electroless silver bath.

A specific example of an electroless copper deposition bath suitable for use is as follows:

|  | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil thick in about 51 hours.

Utilizing the electroless metal baths of the type described, very thin conducting metal films or layers will be laid down on the image comprising metal nuclei. Ordinarily, the metal films super-imposed on the image of metal nuclei by electroless metal deposition will range from 0.1 to 7 mils in thickness, with metal films having a thickness of even less than 0.1 mil being a distinct possibility.

Among its embodiments, the present invention contemplates metallized substrates in which the electroless metal, e.g., copper, nickel, cobalt, silver, gold or the like, has been further built up by attaching an electrode to the electroless metal surface and electrolytically, i.e., galvanically depositing on it more of the same or different metal, e.g., copper, nickel, cobalt, silver, gold, rhodium, tin, alloys thereof, and the like. Electrolytic plating procedures are conventional and well known to those skilled in the art.

For example, a pyrophosphate copper bath is commercially available for operating at a pH of 8.1 to 8.4, a temperature of 50° C., and a current density of 50 amp./sq.ft. In addition, a suitable fluoborate copper bath is operated at a pH of 0.6 to 1.2, a temperature of 25°–50° C., and a current density of 25 to 75 amp. per sq. ft. and is comprised of:

| copper fluoborate | $Cu(BF_4)_2$ | 225 – 450 g./l. |
|---|---|---|
| fluoboric acid, | $HBF_4$ | 2 – 15 g./l. |
| boric acid, | $H_3BO_3$ | 12 – 15 g./l. |

For printed circuit application, copper deposits for use as the basic conductor material are usually 0.001 to 0.003 in. thick.

Silver may be deposited electrolytically from a cyanide bath operated at a pH of 11.5 to 12, a temperature of 25°–35° C., and a current density of 5–15 amp./sq.ft. An illustrative electrolytic silver bath is comprised of:

| silver cyanide, | AgCN | 50 g./l. |
|---|---|---|
| potassium cyanide, | KCN | 110 g./l. |
| potassium carbonate, | $K_2CO_3$ | 45 g./l. |
| brighteners |  | Variable |

Gold may be deposited electrolytically from an acid gold citrate bath at pH 5–7, a temperature of 45°–60° C., and a current density of 5–15 amp.sq.ft. An illustrative electrolytical gold bath consists of:

| Sodium gold cyanide, | $NaAu(CN)_2$ | 20 – 30 g./l. |
|---|---|---|
| dibasic ammonium citrate | $(NH_4)_2C_6H_5O_7$ | 25 – 100 g./l. |

Nickel can be electrolytically deposited at pH 4.5 to 5.5., a temperature of 45° C., and a current density of 20 to 65 amp./sq. ft. the bath containing:

| nickel sulfate, | $NiSO_4 6H_2O$ | 240 g./l. |
|---|---|---|
| nickel chloride, | $NiCl_2 6H_2O$ | 45 g./l. |
| boric acid, | $H_3BO_3$ | 30 g./l. |

Tin and rhodium and alloys can be electrolytically deposited by procedures described in Schlabach et al, Printed and Integrated Circuitry, McGraw-Hill, New York, 1963, pages 146–148.

It is essential in carrying out the process of this invention to use a clean substrate — otherwise adhesion, as measured by the work needed to peel the electroless metal from the substrate, will be non-existent. Resinous bases will benefit from chemically cleaning and/or polarizing the surface. With adsorbent substrates, e.g., glass cloth, fabrics paper, and the like, no special pretreatment is required, but the surface must be clean.

If the base is a resinous laminate, e.g., having holes drilled through or punched therein, conventional cleaning methods are used to remove all contaminants and loose particles. The surface should be "chemically clean", i.e., free of grease, and surface films. A simple test is to spray the surface with distilled water. If the surface is chemically clean, the water will form a smooth film. If not, the water will break into droplets.

A base can be made clean by scrubbing with pumice or the like to remove heavy soils; rinsing with water; and subsequently removing soiling due to organic substances with a suitable alkaline cleaning composition, e.g.:

| sodium isopropyl naphthalene sulfonate | 3 g./l. |
|---|---|
| sodium sulfate | 1 g./l. |
| sodium tripolyphosphate | 14 g./l. |
| sodium metasilicate | 5 g./l. |
| tetrasodium pyrophosphate | 27 g./l. |

This operation is desirably performed at 160°–180° F. The surfaces are exposed to the bath for 5 to 30 minutes. Other suitable alkali cleaning compositions, detergents and soaps may be used, taking care in the selection not to have the surface attacked by the cleaner. If present, surface oxides can be removed from metal surfaces with light etchants, such as 25% ammonium persulfate in water, or the cupric chloride etchant of U.S. Pat. No. 2,908,557. On the other hand, if the shape of the base permits, a sanding operation with fine abrasive can also be used to remove oxides.

Some resinous substrates, e.g., epoxy resin impregnated fibrous structures an epoxy resin varnish coated resin impregnated fiber structures benefit from an additional surface treatment, e.g., the direct bonding pretreatment process of copending U.S. Ser. No. 72,852, filed Sept. 16, 1970, incorporated by reference. This helps to achieve strong adhesion of electroless metal deposits to such bases.

This generally comprises treating the base with a suitable organic or inorganic acid, e.g., chromic acid and/or sulfuric acid or a base solution to render it porous. In many cases, it is desirable to also treat the surface with an agent, e.g., dimethyl formamide or dimethyl sulfoxide before or during the etching process. The effect of such treatments is to render the surface temporarily polar.

Depending upon the particular insulating bases involved, other ion exchange imparting materials may be utilized to effect the aforementioned polarization reaction. For example, acidified sodium fluoride, hydrochloric and hydrofluoric acids, chromic acid, borates, fluoborates and caustic soda, as well as mixtures thereof, have been found effective to polarize the various synthetic plastic resin insulating materials described herein.

In a typical procedure, after treatment with the polarization agents, such resinous insulating bodies are rinsed so as to eliminate any residual agents, following which they are immersed in a solution containing a wetting agent, the ions of which are base exchanged with the surface of the insulating base to thereby impart to the base relatively long chained ions which also are capable of chemically linking with precious metal ions or ionic complexes containing precious metal ions. Following treatment with the wetting agent, the insulating bodies are rinsed again so as to eliminate the residual wetting agent solution.

DESCRIPTION OF THE SPECIFIC EMBODIMENTS

The following examples illustrate the methods and articles of this invention. They are not to be construed to limit the invention in any manner whatsoever.

Procedure A

An epoxy-glass laminate having holes drilled in it for through hole connections is cleaned with a hot alkaline cleaner of the type described above, and loose particles are removed.

A diagram is block printed on the clean laminate using as the "ink" a solution of the following formulation:

| | |
|---|---|
| cupric formate | 10 g. |
| anthraquinone 2,6-disulfonic acid disodium salt | 2 g. |
| water | 100 ml. |
| glycerine | 1 g. |

The printed substrate is placed in an oven for 10–20 minutes at 130°–140° C. to produce a real image by reducing the copper salt to copper nuclei.

The substrate having a darkened real image on its surface is removed from the oven and allowed to cool.

An electroless copper layer is deposited on the real image by immersing the substrate in a bath at 55° C., the bath having the following composition:

| | |
|---|---|
| cupric sulfate | 0.03 moles/l. |
| sodium hydroxide | 0.125 moles/l. |
| sodium cyanide | 0.0004 moles/l. |
| formaldehyde | 0.08 moles/l. |
| tetrasodium ethylenediamine tetraacetate | 0.036 moles/l. |
| water | remainder. |

Selected areas of the base, corresponding to the real image, and the walls of the holes in the base are covered with a filmly adherent layer of bright, ductile electrolessly deposited copper.

The procedure is repeated, except that the entire base is dip-coated with the metal salt solution and air dried. The real image is formed by applying a heated die to the surface, the elevated portions of the die in contact with the surface heating selected areas thereof. A substantially similar article is obtained.

Procedure B

The procedure of Procedure A is repeated substituting for the laminated base, an unclad epoxy impregnated glass fiber laminate (Westinghouse M-6528). The base is activated as follows:

a. Treat the surface of the base by immersion for 1 minute in a 1:1 volume mixture of 1,1,1-trichloroethane and dimethylformamide (DMF), also containing 1 g./l. of Surfactant 6G (Olin Corp.), and drain for 10 seconds.

b. Place the work piece in an "air exhaust chamber" for 2 minutes to selectively evaporate the trichloroethane leaving behind an even wet coating of DMF.

c. Immerse the work piece in an activator solution at 45° C. for 10 minutes, the solution comprising:

| | |
|---|---|
| $CrO_3$ | 100 g./l. |
| Conc.$H_2SO_4$ | 300 ml./l. |
| Water | to make 1 liter |
| (Heated at 100° C. for 1 hour and cooled to 45° C. before use). | | and drain for at least 30 seconds.

d. Place workpieces in a first neutralizer for 5 minutes at room temperature, the first neutralizer bath comprising

| |
|---|
| 20 g./l. sodium bisulfite |
| 1 g./l. Surfactant 6G |
| $H_2SO_4$ to pH 4.0 |
| Water to make. | e. Immerse the work piece for 10 minutes in a second neutralizer bath of the same composition as (d).

f. Rinse the work piece in cold running tap water for 10 minutes.

g. Place work pieces in hot alkaline rinse at 93° C. for at least 15 minutes, the alkaline rinse comprising 75 g./l. of NaOH and 0.5 g./l. of Surfactant 6G in tap water.

h. Subject the work piece a final rinse in cold running tap water.

i. Dry in air under normal room conditions.

The selected areas of the activated base are covered with a real image and an electroless copper layer is deposited on the image by the procedure of Procedure A.

Procedure C

The procedure of Procedure A is repeated, substituting an activated epoxy glass laminate as the base (Procedure B) and the images are formed from metal salt baths of the following composition:

| | |
|---|---|
| cupric formate | 10 g. |
| water | 100 ml. |
| glycerine | 6 g. |
| surface active agent (Rohm & Haas, Triton X-100) | 1 g. |

There are obtained electrolessly metallized substrates according to this invention.

Procedure D

A clean, polarized epoxy-glass laminate (Procedure B) is dip coated with a metal salt solution of the formula:

| | |
|---|---|
| cupric formate | 10 g. |
| anthraquinone 2,6-disulfonic acid disodium salt | 2 g. |
| water | 1000 ml. |
| glycerine | 10 g. | and allowed to dry at 50°–60° C. for 5 minutes.

The substrate is exposed through a photographic negative to ultraviolet light for 1 to 2 minutes, forming a real image of copper. To build up the real image and to enhance contrast, the substrate is then heated for 3 to 5 minutes at 130° to 140° C.

Example 1

No heating step is needed with the following alternative formulation:

| | |
|---|---|
| cupric acetate | 8 g. |
| pentaerythritol | 50 g. |
| citric acid | 40 g. |
| anthraquinone 2,6-sulfonic acid disodium salt | 16 g. |
| stannous chloride | 0.5 g. |
| Surfactant 6G (Olin Corp.) | 1 g. |
| water (to make) | 1000 ml. |

The unexposed portion of the surface layer is removed from the substrate by rinsing in water. The metallic image is built up by electrolessly depositing copper onto the substrate from a bath as described in Procedure A.

Instead of selective exposure, paper is selectively covered by free hand printing with a design using the same cupric acetate solution as an ink. A real image of copper is formed after exposure to light, corresponding to the design. This is built up with an electroless copper deposit.

Instead of epoxy-glass laminates, paper, woven fabrics, cardboard, ceramics and glass can be used as the substrates.

Flexible printed circuits are made by this method as follows:

a. treat a bibulous paper or flexible plastic film substrate with the metal salt solution;

b. dry for 5 to 10 minutes at 60° C.;

c. expose the dry coating through a negative to an ultraviolet light source;

d. develop by removing the unexposed metal salts under a warm water rinse;

e. immerse the treated paper of plastic film into an electroless copper solution and plate up to the desired thickness of metal;

f. neutralize the treated paper on film, wash and dry; and g. coat the treated paper or film with a polymerizable resin and polymerize the resin.

In another variation of the process, the substrate is printed with the solution to form a circuit pattern, then exposed to ultraviolet light without a pattern to form a real image corresponding to the design. The metal is electrolessly deposited until a sufficient amount of metal has been built up to serve as a common cathode for electroplating. Alternatively, the base is covered all over with the metal salt coating and exposed to ultraviolet light without a pattern, a thin electroless metal plate is deposited to serve as a common cathode. Then, a negative print a mask is applied and the metal is built up by electrolytic plating. The background electroless metal can then be removed by a quick etch.

Examples 2 – 5

The procedure of Example 1 is repeated (without heating) substituting the following reducible salt solutions:

Examples 2

| | |
|---|---|
| cupric formate | 10 g. |
| anthraquinone 2,6-disulfonic acid disodium salt | 3 g. |
| water | 450 ml. |
| glycerine | 30 ml. |
| citric acid | 30 g. |
| stannous chloride | 1 g. |
| fluorocarbon wetting agent (3-M Co., FC-170) | 0.25 g. |

Example 3

Prepare Part A:

| | |
|---|---|
| cupric gluconate | 15 g. |
| water | 200 g. |

Prepare Part B:

| | |
|---|---|
| fluorocarbon wetting agent (FC-170) | 0.1 g. |
| glycerine | 30 g. |
| citric acid | 30 g. |
| anthraquinone 2,6-disulfonic acid disodium salt | 2 g. |
| stannous chloride | 1 g. |

| | |
|---|---|
| water | 250 g. |

Mix A and B.

Examples 4 and 5

Prepare Part A:

| | | |
|---|---|---|
| cupric acetate | 15 g. | |
| cupric nitrate | | 15 g. |
| water | 200 g. | 200 g. |

Prepare Part B:

| | | |
|---|---|---|
| wetting agent (FC-170) | 0.25 g. | 0.25 g. |
| glycerine | 30 g. | 30 g. |
| citric acid | 30 g. | 30 g. |
| anthraquinone 2,6-disulfonic acid disodium salt | 3 g. | 3 g. |
| water | 250 g. | 25 g. |
| stannous chloride | 1 g. | 1 g. |

A and B are then mixed.

Example 6

The procedure of Procedure D is repeated, substituting for the cupric formate solution, the following solution:

| | |
|---|---|
| cupric acetate | 4 g. |
| L-ascorbic acid | 5 g. |
| pentaerythritol | 25 g. |
| sorbitol | 30 g. |
| citric acid | 20 g. |
| stannous chloride | 0.5 g. |
| Surfactant 6G | 0.5 g. |
| water (to make) | 1000 ml. |

In all cases, substrates metallized in selected areas according to this invention are obtained.

Example 7

The procedure of Example 1 is repeated, substituting for the electroless copper solution, an electroless nickel solution:

| | |
|---|---|
| nickel chloride | 30 g. |
| sodium hypophosphite | 10 g. |
| glycollic acid | 25 g. |
| sodium hydroxide | 12.5 g. |
| water (to make) | 1000 ml. |

Example 8

The procedure of Example 1 is repeated, substituting for the electroless copper solution, an electroless cobalt solution:

| | |
|---|---|
| cobalt chloride | 30 g. |
| sodium hypophosphite | 20 g. |
| sodium citrate dihydrate | 29 g. |
| ammonium chloride | 50 g. |
| water (to make) | 1000 ml. |

The pH is adjusted to 9.5 and the bath temperature is maintained at 90° C. A cobalt layer is built up on the copper image.

Example 9

The procedure of Example 1 repeated, substituting for the electroless copper solution, an electroless gold solution:

| | |
|---|---|
| gold chloride hydrochloride trihydrate | 0.01 mole/l. |
| sodium potassium tartrate | 0.014 mole/l. |
| dimethylamine borane | 0.013 mole/l. |
| sodium cyanide | 0.4 g./l. |
| water | q.s.a.d. |

The pH is adjusted to 13 and the bath temperature is maintained at 60° C. A gold layer is built up on the copper image.

Example 10

The procedure of Example 1 is repeated, substituting for the electroless copper solution, an electroless silver solution.

| | |
|---|---|
| silver nitrate | 1.7 g. |
| sodium potassium tartrate | 4.0 g. |
| sodium cyanide | 1.8 g. |
| dimethylamine borane | 0.8 g. |
| water (to make) | 1000 ml. |

The pH is adjusted to 13 and the bath temperature is maintained at 80° C. A silver layer is built up on the copper image.

Example 11

Starting with about 800 ml. of water, another metal salt sensitizing formulation is prepared by adding the other constituents one at a time in the order listed hereinafter and thoroughly mixing the solution under yellow light.

| | |
|---|---|
| sorbitol | 120 g. |
| 2,6-anthraquinone disulfonic acid disodium salt | 16 g. |
| cupric bromide | 0.5 g. |
| cupric acetate | 8 g. |
| Surfactant 6G | 1.5 g. |
| water | sufficient for 1 liter |
| fluoboric acid 40% - sufficient to adjust pH to 3.5. | |

After preparation at room temperature, this solution is employed in treating the various substrates described in Example 1 while following in general the procedure of that example both in the sensitizing and subsequent processing steps, including electroless deposition.

In the case of a clean, polarized epoxy-glass laminate with perforations therein, the panel is immersed for 3–5 minutes in a bath of the above solution maintained at 40° C., drained with careful removal of excess solution from the holes, dried, normalized at room temperature and 30–60% relative humidity, exposed to ultraviolet radiation through a mask and developed by immersion for 2 minutes in a tank containing cold running tap water; all of which steps are performed under yellow light. The exposure to ultraviolet light is carried out in a two-sided Scanex II Printer provided with a 4800 watt air cooled mercury vapor lamp on each side and situated 8 inches away from the vacuum frame with the exposure set at 4.5–5.0 feet per minute through a pattern mask wherein the desired conductor areas are exposed to the light.

In repeating the treatment with another panel under the same conditions except for omitting the cupric bromide and fluorboric acid from the metal salt sensitizing solution, it is observed that a far more intense metal nuclei image is formed on the epoxy-glass laminate with the tabulated formulation of this example than with the formulation devoid of halide and fluoboric acid.

It has been observed that the sensitizer solution of this invention is quite stable and can be employed for periods of more than six months with only a little attention, such as filtering the solution each work day and checking its specific gravity along with a weekly check and adjustment as necessary to maintain a pH of 3.5 at 20° C., a metal salt content equivalent to 7.8 to 8.5 grams per liter of cupric acetate and an anthraquinone salt content of 15 to 16 grams per liter.

Procedure E

Numerous samples of clean, polarized epoxy-glass ((FR-4)) laminates are subjected to steps of sensitization through exposure and development of images similar to those of Example 11 except for employing different sensitizing baths and an exposure of 2 minutes to a 1500-watt ultraviolet light source through a Stouffer 21-step tablet or optical wedge.

The composition of the control sensitization bath is:

| | |
|---|---|
| sorbitol | 120 g. |
| anthraquinone 2,6-di- | |
| sulfonic acid disodium salt | 16.2 g. |
| potassium bromide | 1.0 g. |
| cupric acetate | 9.0 g. |
| Surfactant 6G | 1.1 g. |
| water sufficient for | 1 liter |
| pH | 4.62 |

The Stouffer tablet is a mask having 21 small squares of graduated optical density for the graduated transmission of light through different squares in the series. These squares range in density from a completely transparent square designated No. 0 and permitting 100% transmission of ultraviolet light to an opaque square No. 20 that transmits no light. After development and drying of the exposed laminate surfaces, they are examined to observe the number of square images visible on the laminates as a measure of the effectiveness of the sensitizing treatment. A product with a sensitivity rating of at least 5 images is desirable, and ratings of 7 or more are preferred.

Examples 12 – 29

Varying amounts of a number of different acids are thoroughly mixed with separate baths of the sensitizing formulation of Procedure E to adjust the mixtures to various pH levels in illustrating the important effect of acidity in the treating solutions employed in the present process. For comparative purposes, trials I and II and their data are included.

In each of the following examples, one or more specimens of the epoxy-glass bases are treated at each specified pH value, processed and rated according to Procedure E; and the specific data and results are set forth in Table I hereinafter.

TABLE I

| Example | Acid Additive | pH | Individual Specimen Sensitivity Ratings | | | Average Sensitivity Rating |
|---|---|---|---|---|---|---|
| Control | none | 4.62 | 6 | 5 | 7 | 6.0 |
| I* | citric | 1.4 | 3 | 5 | 5 | 4.3 |
| 12 | citric | 2.05 | 6 | 6 | 7 | 6.3 |
| 13 | citric | 2.1 | 7 | — | — | 7.0 |
| 14 | citric 45 g./liter | 2.4 | 8 | — | — | 8.0 |
| 15 | citric 22.5 g./liter | 2.5 | 10 | 10 | 11 | 10.3 |
| 16 | citric | 2.6 | 10 | — | — | 10.0 |
| 17 | citric 10.0 g./liter | 2.92 | 8 | 9 | 11 | 9.3 |
| 18 | citric | 3.5 | 8 | 8 | 9 | 8.3 |
| 19 | citric | 3.96 | 8 | 8 | 10 | 8.6 |
| II* | fluoboric 40% aqueous | 1.06 | 0 | 0 | 0 | 0 |
| 20 | fluoboric | 2.0 | 8 | 10 | 9 | 9.0 |
| 21 | fluoboric | 2.5 | 8 | 10 | 9 | 9.0 |
| 22 | fluoboric | 2.90 | — | 10 | 9 | 10.5 |
| 23 | fluoboric | 2.96 | 8 | 10 | 11 | 9.6 |
| 24 | fluoboric | 3.5 | — | 10 | 10 | 10.0 |
| 25 | fluoboric | 3.7 | 7 | 7 | 7 | 7.0 |
| 26 | fluoboric | 4.0 | 7 | 8 | 8 | 7.7 |
| 27 | phosphoric — 80% aqueous 200 drops/liter | 2.05 | 8 | — | — | 8.0 |
| 28 | phosphoric 140 drops/liter | 3.15 | 10 | — | — | 10.0 |
| 29 | sulfuric | 2.0 | 7 | — | — | 7.0 |

*Trial runs — for comparison of results.

In preparing the treating solutions of Table I, tubidity is sometimes encountered in the control and other baths having a pH of the order of 3.5 or higher, whereas the more acid mixtures are clear. However, this does not pose any serious problems, for the turbidity is usually rather slight and does not interfere with sensitization;

moreover the suspended solid matter may be easily filtered out of the liquid.

Another observation is that darker images (i.e., denser deposits) are obtained with sensitizing solutions containing either fluoboric or citric acid rather than phosphoric or sulfuric acid.

By means of additional experiments wherein clean glass slides rather than laminates are processed according to Procedure E with several of the solutions in the table of examples and then subjected to the same abrasion test, it can be demonstrated that solutions containing fluoboric acid or phosphoric acid as the acid additive produce images with stronger adhesion to the glass substrate than treating agents containing citric or sulfuric acid. In some instances, it may be desirable to employ a combination of two or more acids (e.g., citric and phosphoric acids) for adjusting the pH of the sensitizing solution in order to obtain a product having a combination of desired properties, such as a dense image that exhibits superior adhesion to the base.

Further illustrations of the processes and products of this invention are set in the examples tabulated hereinafter for varying the processing under controlled and comparable conditions, particularly in respect to demonstrating the effects of variations of acid and halide agents and concentrations thereof by addition of the specified substances to stock sensitizing solutions. Although, generally employing the technique of Procedure E unless otherwise indicated, the following examples differ from those of Table I in including an electroless copper deposition step in a "copper strike bath" with a subsequent sensitivity rating observation of the dried article as a better evaluation.

PROCEDURE F

For more acidity comparisons, a stock sensitizer solution is made up as before, but without the addition of any acid. The pH is 4.78, and its composition in grams per liter of aqueous solution is:

| | |
|---|---|
| sorbitol | 120 |
| 2,6-anthraquinone disulfonic acid disodium salt | 16 |
| cupric acetate | 8 |
| cupric bromide | 0.5 |
| Surfactant 6G | 2.0 |

The pH of samples of this stock solution is then adjusted to specific values with suitable amounts of citric, lactic, and fluoboric acids. Additionally, several high pH samples were prepared, using sodium hydroxide to adjust the pH.

Test panels of clean, polarized epoxy-glass laminates are sensitized in those solutions, dried, exposed, developed and immersed in an electroless copper bath. The drying cycle is three minutes and exposure to UV light consists of two passes on a Scanex II photoprinter, one at a setting of 4.6 feet per minute, and the other at 13.0 feet per minute. Panels are developed in cold running water for 60 seconds, and then immersed immediately in a room temperature copper strike bath for 20 minutes. Photosensitivity is determined by exposure through the 21-step Stouffer optical density wedge with the following results.

TABLE II

| Example | Acid | pH | Sensitivity Ratings | |
|---|---|---|---|---|
| | | | Before Cu Strike | After Cu Strike |
| Control | none | 4.78 | 3 | 4 |
| 30 | fluoboric | 4.00 | 7 | 7 |
| 31 | fluoboric | 3.75 | 8 | 8 |
| 32 | fluoboric | 3.50 | 9 | 8.5 |
| 33 | fluoboric | 3.00 | 8 | 8 |
| 34 | fluoboric | 2.50 | 7 | 7 |
| 35 | fluoboric | 2.00 | 6 | 6 |
| 36 | fluoboric | 1.50 | 6 | 6 |
| Trial III | fluoboric | 0.82 | 4 | 3 |
| 37 | lactic | 4.00 | 6 | 7 |
| 38 | lactic | 3.75 | 8 | 8 |
| 39 | lactic | 3.50 | 8 | 8 |
| 40 | lactic | 3.00 | 7 | 7 |
| 41 | lactic | 2.50 | 7 | 7 |
| 42 | lactic | 2.00 | 6 | 6 |
| 43 | lactic | 1.60 | 3 | 3 |
| 44 | citric | 4.10 | 7 | 7 |
| 45 | citric | 3.70 | 10 | 8 |
| 46 | citric | 3.48 | 11 | 9 |
| 47 | citric | 3.00 | 8 | 7 |
| 48 | citric | 2.50 | 7 | 7 |
| 49 | citric 20 g./l. | 1.90 | 7 | 6 |
| 50 | citric 30 g./l. | 1.68 | 6 | 5 |
| 51 | citric 40 g./l. | 1.62 | 6 | 4 |
| Trial IV | (NaOH) | 6.40 | 2 | 1 |
| Trial V | (NaOH) | 11.50* | 0 | 0 |

Note:
*At a pH of 6.4, a precipitate formed; this redissolved at the higher pH.

From consideration of the Table I and II examples, it is evident that treating solutions containing the aforesaid halide ions and acidic material improve the sensitizing insulating substrates at pH levels in the range of about 1.5 to 4.0 and that a significantly higher degree of sensitization is realized with a pH of 2.0 to 4.0 (particularly between 2.5 and 3.8) than is obtainable with more acid or less acid solutions under comparable conditions.

EXAMPLES 52–63

In demonstrating the results obtainable with Procedure F using mixtures or halides other than cupric bromide, another aqueous stock solution is made up without the addition of cupric bromide or acid. The composition in grams per liter of solution is:

| | |
|---|---|
| sorbitol | 120 |
| 2,6-anthraquinone disulfonic acid disodium salt | 16 |
| cupric acetate | 8 |
| Surfactant 6G | 2 |

Various halide compounds are then added to samples of this stock solution in such quantity as to provide a halide ion concentration of 4.5 milliequivalents which is equal to 0.5 g./l. of cupric bromide. The pH of each sample is then adjusted to 3.50, if necessary, using fluoboric acid. In Example 53, more than 4.5 milliequivalents of hydrochloric acid is employed to accomplish the dual function of providing halide ions and adjusting the acidity of the sensitizing bath; hence no fluoboric acid is incorporated into this solution. The halide mixtures of Examples 62 and 63 contain 2.25 milliequivalents of each of the cupric bromide and the sodium fluoride or iodide per liter of sensitizer solution.

TABLE III

| Example | Halide | pH | Sensitivity Rating |
|---|---|---|---|
| Control | none | 3.50 | 3 |
| 52 | HCl | 3.50 | 4 |
| 53 | HCl* | 3.50 | 4 |
| 54 | CuCl | 3.50 | 6 |
| 55 | HI* | 3.40 | 4 |
| 56 | NaI | 3.50 | 7 |
| 57 | NaI** | 3.50 | 6 |
| Trial VI | NaI | 6.00 | 2 |
| Trial VII | NaI | 11.5 | 2 |
| 58 | KI | 3.30 | 6 |
| 59 | KI | 1.50 | 0 |
| 60 | bromine-water | 3.50 | 7 |
| 61 | $CuBr_2$ | 3.50 | 8 |
| 62 | $CuBr_2$+NaF | 3.50 | 9 |
| 63 | $CuBr_2$+NaI | 3.50 | 7 |

*HCl or HI in larger amounts as the sole acid.

Trials with sensitizing solutions employing fluoride ions as the sole halide do not appear to increse sensitization over the control. While iodides alone tend to precipitate part of the copper content of the sensitizer as cuprous iodide, this does not interfere in most instances with the production of good images; moreover, the precipitate may be removed by filtering.

EXAMPLES 64–72

For appraising the effect of halide concentration in sensitizer solutions, a large batch of the stock solution of Examples 52–63 is prepared and 40% aqueous fluoboric acid is added to lower the pH to 3.50. This batch is then divided into ten baths and cupric bromide is dissolved with thorough mixing in the proportions specified in table IV. Then epoxyglass laminates are treated and evaluated as in Procedure F with the following results:

TABLE IV

| Example | $CuBr_2$-g./l. | pH | Sensitivity Rating After Cu Strike |
|---|---|---|---|
| Control | 0 | 3.50 | 2 |
| 64 | 0.5 | 3.50 | 8 |
| 65 | 1.0 | 3.50 | 7 |
| 66 | 1.5 | 3.50 | 6 |
| 67 | 1.75 | 3.50 | 6 |
| 68 | 2.0 | 3.50 | 6 |

TABLE IV-continued

| Example | $CuBr_2$-g./l. | pH | Sensitivity Rating After Cu Strike |
|---|---|---|---|
| 69 | 2.5 | 3.50 | 6 |
| 70 | 3.0 | 3.50 | 4 |
| 71 | 4.0 | 3.50 | 3 |
| 72 | 5.0 | 3.50 | 0 |

From the data in Table IV, it is apparent that the concentration of halide ion is important for improving the efficiency of sensitizing baths. Amounts of halide ions above about 25 milliequivalents per liter markedly reduce sensitization. Accordingly, it is desirable to keep the cupric bromide concentration between about 0.1 and 2.5 grams per liter, and preferably between about 0.3 and 1.0 g./l. Similarly desirable portions for other bromide or halide agents may be computed from the ranges for cupric bromide on a chemical equivalent basis.

Also, unsatisfactory results are obtained when attempts are made to repeat Examples 64–72 with the cupric acetate omitted from the sensitizer. This is interpreted as an indication that the number of equivalents of copper or other cation of the reducible non-noble metal salt should be in excess of the number of equivalents of halide ion in the sensitizing solution. In general, a substantial excess is preferred, as exemplified by a 5:1 or greater ratio of metal: halide equivalent weights.

It is further evident from the foregoing data that both the acidity level and halide ion concentration must be within the aforesaid limited ranges to obtain the full benefits of the present invention. A combination effect is involved here, as neither factor alone can provide those advantages. The data in Tables I and II demonstrate that substantial losses in the sensitizing effect occur when the pH of the sensitizer is below 1.5 or above 4.0 even with a preferred amount of halide in solution. In Table IV, marked reductions in sensitization are noted even with the pH at the preferred 3.5 level for solutions containing either no copper bromide or an excessive quantity, e.g., three or more grams per liter.

The non-conductive real images of nickel, cobalt, iron and silver prepared as described above can also be built up as described for the copper images in these examples with electroless nickel, cobalt, gold and silver.

All such images having a layer of electroless metal on top, can further be built up with an electroplated layer of copper, silver, gold, nickel, cobalt, tin, rhodium and alloys thereof, using the baths and conditions described hereinabove.

The above disclosure demonstrates that the present process provides for the selective reduction of a metal salt to metallic nuclei by means of radiant energy such as heat or light. The formation of a real image of a printed circuit or other type of pattern formation formation has been demonstrated both by printing and by selectively exposing the dry coating of the metal salt to UV radiation, through a negative in the presence of a light sensitive compound and a reducing agent. The positive, visible image has been shown to be catalytic to electroless metal deposition and this metal can be used to build up conductor thickness for increased current carrying capacity or to increase the thickness of the pattern. In contrast to prior art techniques, the metallic image produced by this process requires no additional development steps.

It is obvious that if the metal salt is reduced to its metallic state in the holes of a printed circuit substrate board, simultaneously with the circuit pattern being printed on the surface of the base material, the holes walls will be rendered catalytic to electroless metal deposition and there will be formed electrically interconnecting pathways for circuitry on both sides of the base materials.

It is possible to make interconnection through the holes, around the edges of the boards and through slots made in the base material. A unique advantage of the present process is that only the portion of the hole which is exposed to activation is sensitized and becomes catalytic. If, for example, a negative of a conductor line passes over a hole or a slot, positive, slightly enlarged, catalyzed image will form on opposite sides of the hole walls. This permits electroless metal deposition to take place only on the exposed areas in the holes. It is possible in this way, with shading, for example, to make multiple connections through the same hole, thereby reducing the number of holes required to make interconnections of individual conductors from outside surfaces of the circuit boards.

Substrates can include epoxy-glass laminates, polyester film, ceramics, paper, or other substrates having oxidizable, e.g., adhesive-coated surfaces, and the like. The direct bonding treatment described above provides a very active surface to which the metal salt strongly adsorbs and ultimately there is formed a strong bond between the base and the electrolessly deposited metal.

In addition to printed circuit boards, positive reproductions of photographs can be made from negatives onto paper and then metallized by electroless deposition. The process is capable of producing high resolution, and is not unduly sensitive to long exposures.

A secondary reducer that is also a humectant, as exemplified by sorbitol, is generally preferred as a constituent of the treating solution, for the humectant, apparently by reason of a moisture conditioning effect on the "dry" coating prior to developing. This provides substantial aid in maintaining image density in exposed areas of the coating on the base during the developing step in which unexposed areas of the coating are washed off of the base.

The invention in its broader aspects is not limited by the specific steps, methods, compositions and improvements shown and described herein, and departures may be made within the scope of the accompanying claims without departing from the principles thereof.

We claim as our invention:

1. In a process for selectively metallizing insulating substrates with real images, the steps which comprise depositing on said substrate a layer of a radiation-sensitive composition by treating the substrate with a solution having a pH between about 1.5 and 4.0 as well as a minor content by weight of at least one halide ion of the group consisting of chloride, bromide and iodine ions and comprising a reducible salt of a non-noble metal with the cations of said metal present in a larger proportion of equivalents than said halide ions, a radiation-sensitive reducing agent for said salt, and a secondary reducer in an aqueous medium, and exposing said layer to radiant energy to reduce said metal salt to metallic nuclei thereof and wherein at least one of said treating and exposing steps is restricted to a selected pattern on said substrate to produce a non-conducting real image of said metallic nuclei in said selected pattern and capable of directly catalyzing the deposition thereon of metal from an electroless metal bath.

2. A process as defined in claim 1 wherein said radiant energy comprises heat, light, X-ray radiation or electron beams.

3. A process as defined in claim 1 wherein said base is a non-metallic resinous base, the surface of which is polarized.

4. A process as defined in claim 1 wherein said salt is of the group consisting of reducible copper, nickel, cobalt and iron salts.

5. A process as defined in claim 1 wherein said substrate is thereafter exposed to an electroless metal bath to build up a layer of electroless metal on said image.

6. A process as defined in claim 5 wherein the said electroless metal is of the group consisting of copper, nickel, cobalt, gold and silver.

7. A process as defined in claim 5 wherein the treated substrate is dried before the exposure to radiant energy, and said substrate is rinsed after said exposure to radiant energy and prior to the exposure to said electroless metal bath.

8. A process as defined in claim 5 wherein said salt is of the group consisting of reducible salts of copper, nickel, cobalt and iron, and said electroless metal is of the group consisting of copper, nickel, coblt, gold and silver.

9. A process as defined in claim 5 wherein said salt is a reducible copper salt and said electroless metal is copper.

10. A process as defined in claim 5 wherein said substrate is a non-metallic resinous substrate with a polarized surface.

11. A process as defined in claim 1 wherein said substrate is a porous material.

12. A proces as defined in claim 1 wherein said reducing agent is a light-sensitive reducing compound of the group consisting of iron salts, dichromates, anthraquinone disulfonic acids and salts, glycine and L-ascorbic acid.

13. A process as defined in claim 1 wherein said secondary reducer is a polyhydroxy alcohol.

14. A process as defined in claim 1 wherein said radiation-sensitive reducing agent comprises anthraquinone 2,6-disulfonic acid disodium salt.

15. A process as defined in claim 5 wherein said liquid medium also contains citric acid and said secondary reducer is a polyhydroxy alcohol of the group consisting of glycerine, sorbitol, pentaerythritol and mesoerythritol.

16. A proces as defined in claim 1 wherein a substrate having at least one hole therein is subjected to said process to produce said image on at least a selected area on the wall surface of said hole.

17. A process as defined in claim 16 wherein said substrate is thereafter exposed to an electroless metal bath to build up a layer of electroless metal on said image on said wall surface in producing a metal conductor extending through said hole.

18. A process as defined in claim 1 wherein said solution contains between about 0.9 and 25 milliequivalents of said halide ions based on the total weight of said solution.

19. A process as defined in claim 1 wherein said solution contains bromide ions.

20. A process as defined in claim 18 wherein said solution contains cupric bromide.

21. A process as defined in claim 1 wherein said solution contains a humectant.

22. A process as defined in claim 21 wherein said secondary reducer comprises sorbitol.

23. A process as defined in claim 1 wherein the pH of said solution is between about 2.5 and 3.8.

24. In a process for selectively metallizing insulating substrates with real images, the steps which comprise depositing on said substrate a layer of a radiation-sensitive composition by treating the substrate with a solution having a pH between about 1.5 and 4.0 as well as a minor content by weight of at least one halide ion of the group consisting of chloride, bromide and iodine ions and comprising a reducible salt of a non-noble metal with the cations of said metal present in a larger proportion of equivalents than said halide ions, a radiation-sensitive reducing agent for said salt, and a secondary reducer in an aqueous medium, and selectively exposing said layer to light to reduce said metal salt to metallic nuclei thereof to produce a non-conducting real image of said metallic nuclei in said selected pattern and capable of directly catalyzing the deposition thereon of metal from an electroless metal bath.

25. A process as defined in claim 24 wherein said base is a non-metallic resinous base, the surface of which is polarized.

26. A process as defined in claim 24 wherein said salt is of the group consisting of reducible copper, nickel, cobalt and iron salts.

27. A process as defined in claim 24 wherein said substrate is thereafter exposed to an electroless metal bath to build up a layer of electroless metal on said image.

28. A process as defined in claim 24 wherein the said electroless metal is of the group consisting of copper, nickel, cobalt, gold and silver.

29. A process as defined in claim 27 wherein the treated substrate is dried before the exposure to radiant energy, and said substrate is rinsed after said exposure to radiant energy and prior to the exposure to said electroless metal bath.

30. A process as defined in claim 27 wherein said salt is of the group consisting of reducible salts of copper, nickel, cobalt and iron, and said electroless metal is of the group consisting of copper, nickel, gold and silver.

31. A process as defined in claim 27 wherein said salt is a reducible copper salt and said electroless metal is copper.

32. A process as defined in claim 27 wherein said substrate is a non-metallic resinous substrate with a polarized surface.

33. A process as defined in claim 24 wherein said substrate is a porous material.

34. A process as defined in claim 24 wherein said reducing agent is a light-sensitive reducing compound of the group consisting of iron salts, dichromates, anthraquinone disulfonic acids and salts, glycine and L-ascorbic acid.

35. A process as defined in claim 24 wherein said secondary reducer is a polyhydroxy alchohol.

36. A process as defined in claim 24 wherein said radiation-sensitive reducing agent comprises anthraquinone 2,6-disulfonic acid disodium salt.

37. A process as defined in claim 27 wherein said liquid medium also contains citric acid and said secondary reducer is a polyhydroxy alcohol of the group consisting of glycerine, sorbitol, pentaerythritol and mesoerythritol.

38. A process as defined in claim 24 wherein a substrate having at least one hole therein is subjected to said process to produce said image on at least a selected area on the wall surface of said hole.

39. A process as defined in claim 38 wherein said substrate is thereafter exposed to an electroless metal bath to build up a layer of electroless metal on said image on said wall surface in producing a metal conductor extending through said hole.

40. A process as defined in claim 24 wherein said solution contains between about 0.9 and 25 milliequivalents of said halide ions based on the total weight of said solution.

41. A process as defined in claim 24 wherein said solution contains bromide ions.

42. A process as defined in claim 40 wherein said solution contains cupric bromide.

43. A process as defined in claim 24 wherein said solution contains a humectant.

44. A process as defined in claim 43 wherein said secondary reducer comprises sorbitol.

45. A process as defined in claim 24 wherein the pH of said solution is between about 2.5 and 3.8.

46. In a process for selectively metallizing insulating substrates with real images, the steps which comprise depositing on said substrate a layer of a radiation-sensitive composition by treating the substrate with a solution having a pH between about 1.5 and 4.0 as well as a minor content by weight of at least one halide ion of the group consisting of chloride, bromide and iodine ions and comprising a reducible salt of a non-noble metal with the cations of said metal present in a larger proportion of equivalents than said halide ions, a radiation-sensitive reducing agent for said salt, and a secondary reducer in an aqueous medium, and selectively exposing said layer to ultraviolet radiation to reduce said metal salt to metallic nuclei thereof to produce a non-conducting real image of said metallic nuclei in said selected pattern and capable of directly catalyzing the deposition thereon of metal from an electroless metal bath.

47. An article which comprises an insulating substrate, an aperture in said substrate, at least a selected area of the wall surface of said aperture being coated with a radiation-sensitive composition having a minor content of at least one halogen of the group consisting of chlorine, bromine and iodine and comprising a reducible salt of a non-noble metal with the content of said metal amounting to a larger proportion of equivalents than said halogen, a radiation-sensitive reducing agent for said salt, a secondary reducer and an acid.

48. An article as defined in claim 47 wherein an area of an outside surface of said substrate is coated with said radiation-sensitive composition in the form of a predetermined real image.

49. An article as defined in claim 47 wherein said substrate is a porous material.

50. An article as defined in claim 47 wherein a polarized wall surface underlies said radiation-sensitive composition.

51. An article as defined in claim 47 wherein said salt is of the group consisting of reducible salts of copper, nickel, cobalt and iron, and said reducing agent is a light-sensitive reducing compound of the group consisting of iron salts, dichromates, anthraquinone disulfonic acids and salts, glycine and L-ascorbic acid.

52. An article as defined in claim 47 wherein said secondary reducer is a polyhydroxy alcohol.

53. An article as defined in claim 47 wherein said composition comprises a reducible copper salt, anthraquinone 2,6-disulfonic acid disodium salt as said radiation-sensitive reducing agent, stannous chloride, citric acid and a secondary reducer of the group consisting of glycerine, sorbitol, pentaerythritol and mesoerythritol.

54. An article as defined in claim 47 wherein said radiation-sensitive composition contains a bromide compound.

55. An article as defined in claim 47 wherein said radiation-sensitive composition contains between about 0.13 and 0.45% cupric bromide based on the weight of said coating.

56. An article as defined in claim 47 wherein said radiation-sensitive composition contains a humectant.

57. An article as defined in claim 56 wherein said secondary reducer comprises sorbitol.

58. A process as defined in claim 1 wherein a substrate having at least one hole therein is subjected to said process to produce a darkened real image only on its surface.

59. A process as defined in claim 58 wherein said substrate is thereafter exposed to an electroless metal bath to build up a layer of electroless metal on selected areas of the base, corresponding to the real image, and on the walls of said hole.

* * * * *